(12) United States Patent
Nakamura

(10) Patent No.: US 7,598,757 B2
(45) Date of Patent: Oct. 6, 2009

(54) DOUBLE ENDED CONTACT PROBE

(75) Inventor: Shinichi Nakamura, Tokyo (JP)

(73) Assignee: Unitechno Inc., Tokyo (JP)

( * ) Notice: Subject to any disclaimer, the term of this patent is extended or adjusted under 35 U.S.C. 154(b) by 405 days.

(21) Appl. No.: 11/661,102

(22) PCT Filed: Dec. 6, 2005

(86) PCT No.: PCT/JP2005/022326

§ 371 (c)(1),
(2), (4) Date: Feb. 26, 2007

(87) PCT Pub. No.: WO2007/066382

PCT Pub. Date: Jun. 14, 2007

(65) Prior Publication Data

US 2009/0146672 A1    Jun. 11, 2009

(51) Int. Cl.
G01R 1/073    (2006.01)
(52) U.S. Cl. ...................... 324/754; 324/761
(58) Field of Classification Search ......... 324/754–765; 439/91
See application file for complete search history.

(56) References Cited

U.S. PATENT DOCUMENTS 4,724,383 A * 2/1988 Hart ........................... 324/754
7,362,118 B2 * 4/2008 Henry et al. ................. 324/761
7,372,286 B2 * 5/2008 Lee et al. ..................... 324/757

* cited by examiner

Primary Examiner—Ernest F Karlsen
(74) Attorney, Agent, or Firm—Andrew C. Aitken

(57) ABSTRACT

It is an object of the present invention to provide a double-ended contact probe that can be improved in productivity to ensure that the contact members are stably movable with respect to each other, and electrically connected to each other. The double-ended contact probe comprises first and second conductive members 11 and 12 constructed as electrical contact portions, an elastic member 13 made in the form of a hollow shape, the elastic member 13 intervening between the first and second conductive members 11 and 12 to urge the first and second conductive members 11 and 12 in respective directions opposite to each other when one of the first and second conductive members 11 and 12 approaches within a predetermined distance of the other of the first and second conductive members 11 and 12, and a third conductive member 14 accommodated in the elastic member 13, and disposed on a central axis, wherein the elastic member 13 has a pair of end portions for retaining the first and second conductive members 11 and 12, and an intermediate portion for retaining the third conductive member 14 to allow the third conductive member 14 to be pointed in a specific direction, and to be slidably movable with respect to each of the first and second conductive members 11 and 12.

17 Claims, 7 Drawing Sheets

DOUBLE ENDED CONTACT PROBE

CONTINUING DATA

This application is a 371 of PCT/JP2005/022326 filed Dec. 6, 2005.

TECHNICAL FIELD OF THE INVENTION

The present invention relates to a contact probe, and more particularly to a double-ended contact probe to be built in a socket or an apparatus for testing IC package, integrated circuits produced on a wafer, or the like.

DESCRIPTION OF THE RELATED ART

As part of a socket or an apparatus for testing IC package, integrated circuits produced on a wafer, or the like, the conventional double-ended contact probe comprises a couple of conductive members constituted as both ends, and an elastic member intervening between the conductive members to urge the conductive members in directions opposite to each other to ensure that the conductive members keeps in touch with respective objects with an appropriate contact pressure even if the object has an undulating surface.

The conventional double-ended contact probe disclosed in, for example 1, patent document 1 (see FIG. 1(a)) comprises a barrel made in the form of a hollow shaped cylinder, a plunger partially received in, and slidably retained by the barrel, and a coiled compression spring accommodated in the barrel, and adapted to urge the plunger in an axial direction by intervening between an inner end of the plunger and the bottom of the barrel. On the other hand, the conventional double-ended contact probe disclosed in patent document 1 (see FIG. 1(b)) comprises a barrel made in the form of a hollow shaped cylinder, a plunger partially received in, and slidably retained by the barrel, and a coiled compression spring having the plunger partially received therein, and adapted to urge the plunger in an axial direction by intervening between an outer end of the plunger and the rim of the barrel.

The barrel retains the plunger without failing to retain the plunger by reason that the barrel has a rim reduced in diameter as shown in FIG. 5 of patent document 1, or by reason that a socket has an opening reduced in diameter as shown in FIGS. 10 and 13 of patent document 1. The plunger is slidably movable with respect to the barrel under the condition that the plunger has an end brought into contact with an inner surface of the barrel. The coiled compression spring is adapted to urge both the barrel and the plunger in respective directions opposite to each other by intervening between a flange portion of the plunger and a flange portion of the barrel.

Patent document 1: Jpn. examined patent publication No. 3210645

DISCLOSURE OF THE INVENTION

Problems to be Solved by the Invention

The conventional double-ended contact probe, however, encounters such a problem that, it is not easy to deform one end of the barrel in diameter, after inserting said one end of the plunger into the barrel, or after maintaining the coiled compression spring in position, to ensure that the plunger constituted as a male shaped contact member is slidably movable with respect to the barrel constituted as a female shaped contact member without falling out of the barrel.

In the conventional double-ended contact probe to be built into a socket or the like, the plunger constituted as a contact member is axially aligned with the barrel constituted as a contact member. The coiled compression spring has trimmed ends for allowing one of the plunger and the barrel to be slightly inclined with respect to the other of the plunger and the barrel to bring the plunger into contact with the barrel with appropriate contact pressure. However, it is difficult to allowing the plunger to be slidably movable with respect to the barrel with an optimum clearance while bringing the plunger into contact with the barrel with an appropriate contact pressure. Accordingly, the plunger machined at an extremely high accuracy tends to fail to be stably moved in axial directions (in inward and outward directions) with respect to the barrel machined at an extremely high accuracy. In the IC socket built into the apparatus for testing a circuit at a relatively high temperature over a relatively long period of time, the above-mentioned problem gets worse.

It is essential that the conductive member has a contact portion for maintaining electrical conduction to a test object such as for example IC package or the like even if the conductive member comes again and again in touch with the test object, and made of conductive material excellent in hardness. However, it is difficult to select an appropriate material that meets the above-mentioned requirements.

It is, therefore, an object of the present invention to provide a double-ended contact probe that can be improved in productivity, and allow the conductive members to be stably movable with respect to each other while maintaining electrical conduction between the conductive members.

Means for Solving the Problems

In order to solve the above-mentioned problems, there is provided a double-ended contact probe, comprises: (1) first and second conductive members constructed as electrical contact portions; an elastic member made in the form of a hollow shape, the elastic member intervening between the first and second conductive members to urge the first and second conductive members in respective directions opposite to each other when one of the first and second conductive members approaches within a predetermined distance of the other of the first and second conductive members; and a third conductive member accommodated in the elastic member, and disposed on a central axis of the elastic member, wherein the elastic member has a pair of end portions for retaining the first and second conductive members, and an intermediate portion for retaining the third conductive member to allow the third conductive member to be pointed in a specific direction, and to be slidably movable with respect to each of the first and second conductive members.

The double-ended contact probe thus constructed according to the present invention can allow the first and second conductive members to be stably movable with respect to each other while maintaining electrical conduction between the first and second conductive members by allowing the third conductive member retained and pointed in a specific direction by the intermediate portion of the elastic member to intervene the first and second conductive members, and to be slidably movable with respect to each of the first and second conductive members. Each of the first and second conductive members can be simple in shape by reason that the elastic member has end portions for retaining the first and second conductive members. The double-ended contact probe thus constructed according to the present invention can be improved in machinability and in choice of material by reason that the first to third conductive members separated in function are made, without being machined at a relatively high accuracy, from material having specific characteristics.

In the double-ended contact probe according to the present invention, it is preferable that (2) the elastic member is constituted by a coiled compression spring having an intermediate portion smaller in coil pitch than a portion other than the intermediate portion, or (3) the intermediate portion of the elastic member is constituted by a tightly-coiled compression spring.

The double-ended contact probe thus constructed according to the present invention can be allow the third conductive member retained and pointed in a specific direction by the intermediate portion of the elastic member to be slidably movable with respect to each of the first and second conductive members by reason that the intermediate portion of the elastic member is smaller in coil pitch than a portion other than the intermediate portion.

In the double-ended contact probe according to the present invention, it is preferable that (4) the first and second conductive members have respective holes, the third conductive member has end portions slidably received in the respective holes of the first and second conductive members, and an intermediate portion larger in diameter than each of the end portions, the elastic member is adapted to allow the end portions of the third conductive member retained by the elastic member to touch respective inner side surfaces of the holes of the first and second conductive members, and to approach or touch respective bottom surfaces of the holes of the first and second conductive members when the elastic member is compressed in longitudinal direction under the condition that each of the first and second conductive members are slidably movable with respect to the third conductive member retained by the elastic member.

When the third conductive member inserted into the elastic member is brought close to the first conductive member (or the second conductive member) retained by one of the end portions (or the other of the end portions) of the elastic member in the process of assembling the double-ended contact probe, one of the end portions (or the other of end portions) of the third conductive member retained by the elastic member approaches, or touches the bottom surface of the hole of the first conductive member (or the second conductive member). In this process, the third conductive member is automatically retained by the intermediate portion of the elastic member. The double-ended contact probe thus constructed according to the present invention can be improved in productively, and can be simple in fabrication process.

In the double-ended contact probe according to the present invention, (5) it is preferable that the elastic member is constituted by a coiled compression spring, the intermediate portion being smaller in diameter than at least one of the end portions. The double-ended contact probe thus constructed according to the present invention can be improved in productively, and can be simple in fabrication process by reason that the third conductive member is easily inserted into the elastic member in the process of assembling the double-ended contact probe.

In the double-ended contact probe according to the present invention, the elastic member may be constituted by a coiled compression spring. One of the first and second conductive members has a flange portion for touching one end of the coiled compression spring, a conducting portion projected from one end of the flange portion in one of directions opposite to each other, a fitting portion projected from the other end of the flange portion in the other of the directions, and tightly received in one end of the coiled compression spring, and a hole longitudinally extending from one end of the fitting portion, the other of the first and second conductive members has a flange portion for touching the other end of the coiled compression spring, a conducting portion projected from one end of the flange portion in the other of the directions, a fitting portion projected from the other end of the flange portion in one of the directions, and tightly received in the other end of the coiled compression spring, and a hole longitudinally extending from one end of the fitting portion.

The double-ended contact probe thus constructed according to the present invention can be improved in axial displacement of the first and second conductive members by changing, in depth, the holes of the first and second conductive members in a design phase, can prevent each of the first and second conductive members from falling out of the elastic member by reason that the first and second conductive members are tightly retained by the elastic member in fabrication process, and can be improved in construction under the condition that the first and second conductive members are the same in shape as each other. The first and second conductive members can be constituted as duplicated elements.

In the double-ended contact probe according to the present invention, it is preferable that (7) the third conductive member is higher in electric conductivity than the first conductive member. The double-ended contact probe thus constructed as previously mentioned according to the present invention can be improved in electrical property by reason that the third conductive member is longer in electrical pathway than the first conductive member.

In the double-ended contact probe according to the present invention, (8) the third conductive member may be constituted by copper metal, higher in electric conductivity, and smaller in hardness than the first conductive member. The double-ended contact probe according to the present invention can be improved in electrical property, abrasion-resistant property, and durable power.

In the double-ended contact probe according to the present invention, (9) the second conductive member may be higher in electric conductivity than the first conductive member. The double-ended contact probe thus constructed according to the present invention can maintain electrical conduction between the second conductive member and an apparatus for testing an object.

In the double-ended contact probe according to the present invention, (10) each of the first and second conductive members may be the same in electric conductively as the third conductive member. Each of the first to third conductive members can meet electrical requirements and the like by reason that the first to third conductive members are the same in material as each other.

In the double-ended contact probe according to the present invention, (11) the elastic member may be constituted by a coiled compression spring having a side spring portion intervening between one of the end portions and the intermediate portion, and a side spring portion intervening between the other of the end portions and the intermediate portion, the side spring portions being different in free length from each other.

When, for example, the first conductive member comes again and again, and keeps in contact with a test object under the condition that the side spring portions of the coiled compression spring are different in spring characteristics (such as for example a spring contact depending on the number of turns) from each other, the side spring portion positioned on the side of the first conductive member being larger in length than the side spring portion positioned on the side of the second conductive member, the double-ended contact probe according to the present invention can maintain, within an appropriate range, a contact pressure of the first conductive member to the test object while allowing the side spring portion positioned on the side of the second conductive member to point the third conductive member in a specific direction, and can be improved in displacement of one of the first and second conductive members to the other of the first and second conductive members.

In the double-ended contact probe according to the present invention, (12) the side spring portions of the coiled compression spring may be the same in coil pitch as each other. (13) the side spring portions of the coiled compression spring may be different in coil pitch from each other. When the side spring portions different in coil pitch from each other are combined in series, the coiled compression spring acts on the first and second conductive members with non-linear load-displacement characteristics. When, on the other hand, the side spring portions the same in coil pitch as each other are combined in series, the coiled compression spring acts on the first and second conductive members with linear load-displacement characteristics.

In the double-ended contact probe according to the present invention, (14) the elastic member may be constituted by a coiled compression spring having a side spring portion intervening between one of the end portions and the intermediate portion, and a side spring portion intervening between the other of the end portions and the intermediate portion, the side spring portions being different in coil pitch from each other.

When, for example, the first conductive member comes again and again, and keeps in contact with a test object under the condition that the side spring portions of the coiled compression spring are different in spring characteristics (such as for example a spring contact depending on the number of turns) from each other, the side spring portion positioned on the side of the second conductive member being smaller in number of turns than the side spring portion positioned on the side of the first conductive member, the double-ended contact probe according to the present invention can maintain, within an appropriate range, a contact pressure of the first conductive member to the test object while allowing the side spring portion positioned on the side of the second conductive member to point the third conductive member in a specific direction, and can be improved in displacement of one of the first and second conductive members to the other of the first and second conductive members.

In the double-ended contact probe according to the present invention, (15) the side spring portions of the elastic member may be the same in coil pitch as each other, or (16) the side spring portions of the elastic member may be different in coil pitch from each other. When the side spring portions the same in coil pitch as each other are combined in series, the elastic member acts on the first and second conductive members with linear load-displacement characteristics. When, on the other hand, the side spring portions different in coil pitch from each other are combined in series, the elastic member acts on the first and second conductive members with non-linear load-displacement characteristics.

In the double-ended contact probe according to the present invention, (17) the elastic member may have a shape constricted in the middle, the elastic member being constituted by a coiled compression spring having side spring portions the same in inner diameter as each other, and an intermediate portion intervening between the side spring portions, the intervening portion being smaller in inner diameter than each of the side spring portions.

In the process of assembling the double-ended contact probe thus constructed according to the present invention, it is easy to insert the third conductive member into the elastic member, and to connect the first and second conductive members to the elastic member.

ADVANTAGEOUS EFFECT OF THE INVENTION

It is an object of the present invention to provide a double-ended contact probe that can allow the first and second conductive members to be stably movable with respect to each other while maintaining electrical conduction between the first and second conductive members by reason that the third conductive member intervenes between the first and second conductive members to maintain the electrical conduction between the first and second conductive members, the third conductive member retained and pointed in a specific direction by the intermediate portion of the elastic member intervening between the first and second conductive members is slidably movable with respect to each of the first and second conductive members.

It is another object of the present invention to provide a double-ended contact probe that can maintain, within an appropriate range, a contact pressure of the conductive member to a test object while allowing the retainer side spring portion of the elastic member to point the third conductive member in a specific direction by reason that the object side spring portion of the elastic member is smaller in spring constant than the retainer side spring portion of the elastic member, and can be improved in displacement of one of the first and second conductive members to the other of the first and second conductive members. As a result, the double-ended contact probe according to the present invention can maintain electrical conduction to the test object by having a high tolerance for repeated use.

EXPLANATION OF THE REFERENCE NUMERALS

Figure 1:
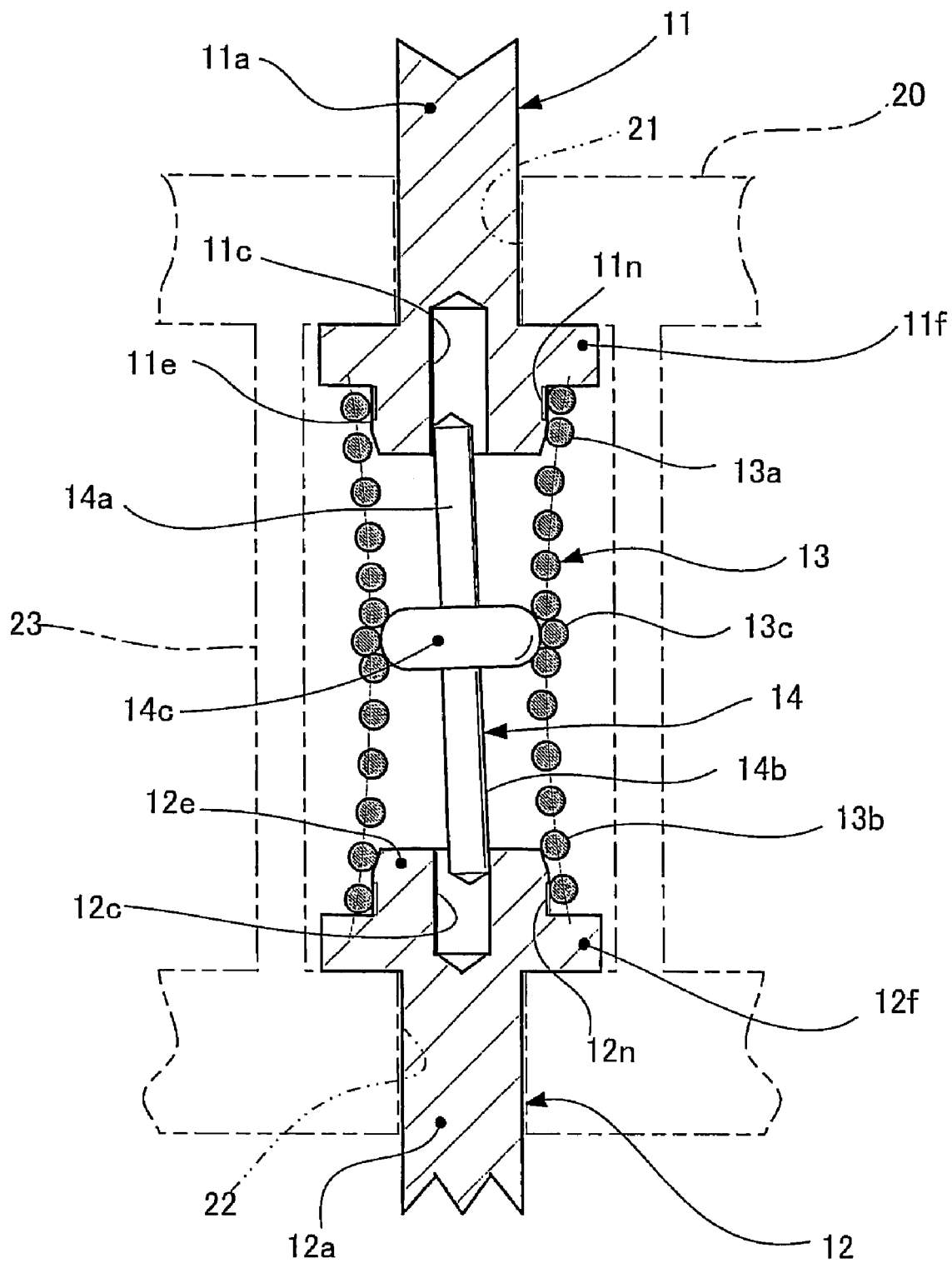
FIG. 1 is a cross-sectional view showing the double-ended contact probe according to the first embodiment of the present invention as part of IC socket or apparatus for testing an object.

11 and 51: first conductive member
11a, 12a, 51a, and 52a: contact portion
11c, 12c, 51c, and 52c: hole
11e, 12e, 51e, and 52e: fitting portion
11f, 12f, 51f, and 52f: flange portion

11*n*, 12*n*, 51*n* and 52*n*: concave portion for reinforcing connection to the third conductive member
12 and 52: second conductive member
13, 53, 63, and 73: coiled compression spring (elastic member, coiled spring)
13*a*, 53*a*, 63*a*, and 73*a*: one of the end portions
13*b*, 53*b*, 63*b*, and 73*b*: the other of the end portions
13*b*, 53*b*, 63*b*, and 73*b*: intermediate portion
14: third conductive member
14*a*: first end portion
14*b*: second end portion
14*c*: intermediate portion
20: IC socket
30: test object
40: circuit board
41: connecting terminal
63*d* and 73*d*: one of the side spring portions
63*e* and 73*e*: the other of the side spring portions

DETAILED DESCRIPTION OF THE PREFERRED EMBODIMENT

The first to fourth embodiments of the double-ended contact probe according to the present invention will be described hereinafter with reference to accompanying drawings.

First Embodiment

Figure 2:
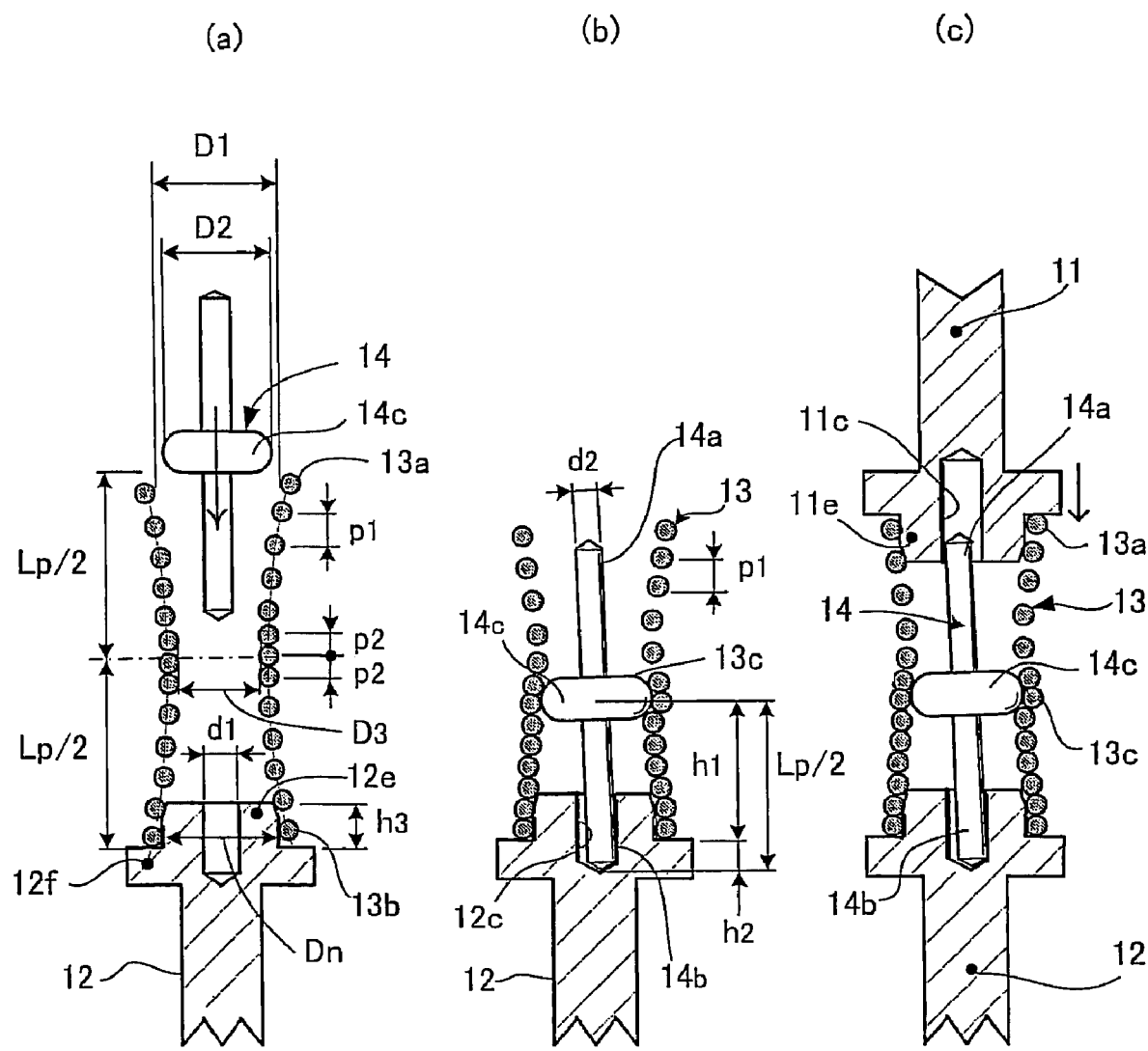
FIG. 2 is a view for explaining a method of assembling the double-ended contact probe according to the first embodiment of the present invention.
Figure 3:
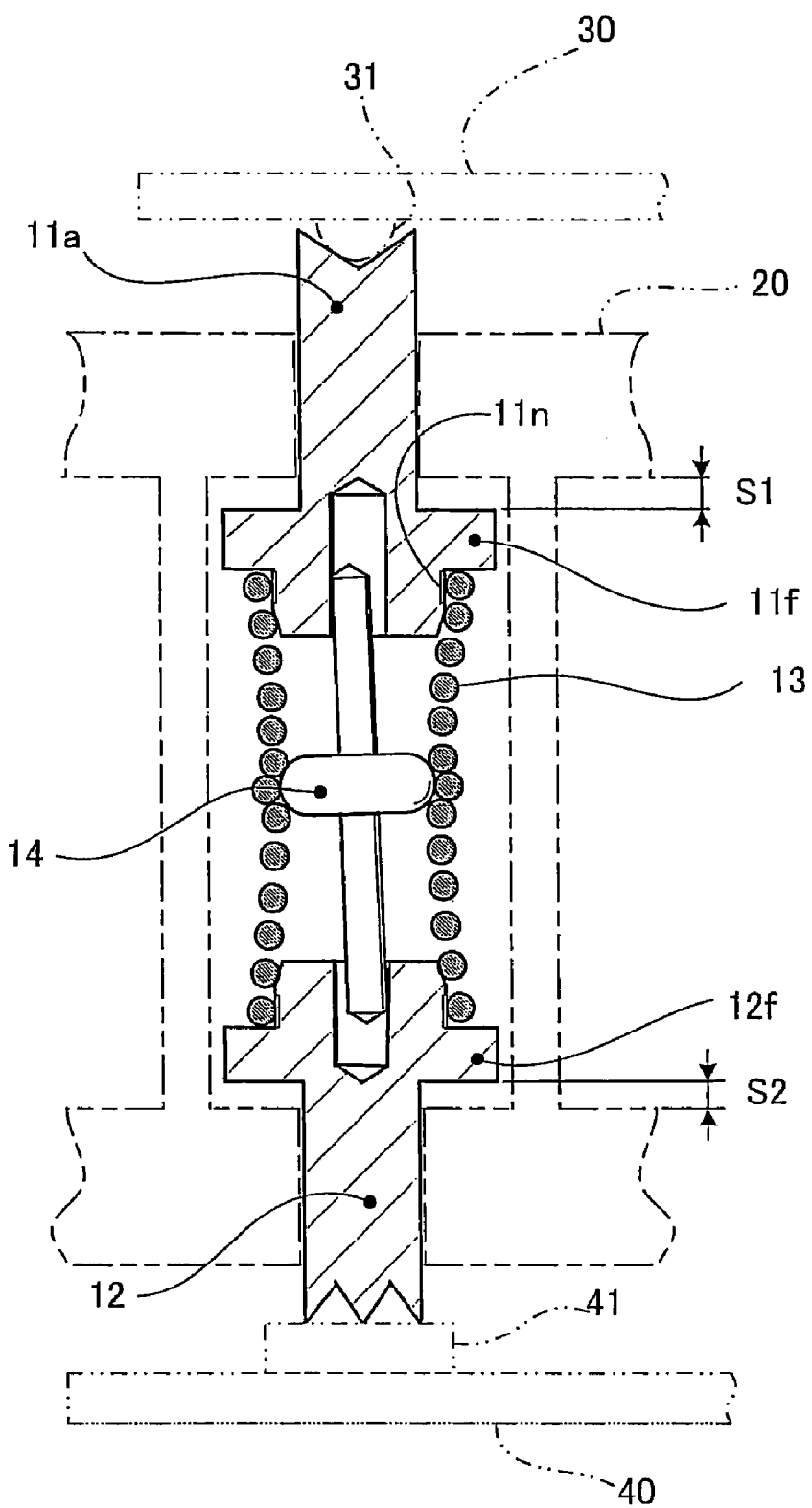
FIG. 3 is a cross-sectional view showing an operation of the double-ended contact probe, built into the IC socket, according to the first embodiment of the present invention.

Referring to FIGS. 1 to 3, there is shown a double-ended contact probe according to the first embodiment of the present invention.

The constitution of the first embodiment of the double-ended contact probe according to the present invention will be firstly described hereinafter with reference to FIG. 1. The double-ended contact probe (or simply referred to as "contact probe") is shown in FIG. 1 as one of contact probes built into IC socket 20 (partially shown) mounted on an apparatus for testing an object, positioned (at even intervals in a horizontal direction shown in FIG. 1) in parallel relationship with each other, received in respective bores, and insulated from each other through partitioning portions 23. As shown in FIG. 1, the double-ended contact probe comprises first and second conductive members 11 and 12 constituted as electrical contact elements, and constituted as end portions axially aligned with each other.

The double-ended contact probe further comprises a coiled compression spring 13 intervening between the first and second conductive members 11 and 12. The coiled compression spring 13 is adapted to urge the first and second conductive members 11 and 12 in respective axial directions opposite to each other, to allow the first and second conductive members 11 and 12 to be movable with respect to each other in the respective axial directions, and to allow contact portions 11*a* and 12*a* of the first and second conductive members 11 and 12 to be projected from the IC socket 20 in the respective axial directions. The first conductive member 11 has a flange portion 11*f* larger in diameter than the contact portion 11*a*, the flange portion 11*f* having an end face brought into contact with one of end faces of the coiled compression spring 13, a fitting portion 11*e* projected from one end of the flange portion 11*f* in an inner direction (the other of the axial directions), and tightly received in one of end portions of the coiled compression spring 13, and a bottomed hole (or through hole) 11*c* having an axis axially aligned with an axis of the flange portion 11*f*. The second conductive member 12 has a flange portion 12*f* larger in diameter than the contact portion 12*a*, the flange portion 12*f* having an end face brought into contact with the other of end faces of the coiled compression spring 13, and a fitting portion 12*e* projected from one end of the flange portion 12*f* in an inner direction (one of the axial directions), and tightly received in one of end portions of the coiled compression spring 13, and a bottomed hole (or through hole) 12*c* having an axis axially aligned with an axis of the flange portion 12*f*. The first and second conductive members 11 and 12 are movable with respect to each other in the axial directions under the condition that the contact portions 11*a* and 12*a* constituted as conductive portions projected from the other ends of the flange portions 11*f* and 12*f* in outer directions are movably received in respective openings 21 and 22 of the IC socket 20.

The first conductive member 11 to be engaged with, and detached from the object with frequency is made of titanium (Ti) series, carbon steel (SK), or other hard metal superior in electrical conductivity and abrasion resistance. On the other hand, the second conductive member 12 to be engaged with a circuit board for testing is made of phosphorus bronze, brass, beryllium copper, or other copper alloy inferior in electrical conductivity and abrasion resistance to the first conductive member 11. Furthermore, the first and second conductive members 11 and 12 may be made of free-machining material. In this case, the first and second conductive members 11 and 12 can be easily made on a lathe and the like.

The coiled compression spring 13 may have an arbitrary shape in cross-section, may be made of arbitrary material such as for example piano wire, stainless steel wire, and plastics, and may be inferior in electric conductively to the first and second conductive materials 11 and 12. In this embodiment, the coiled compression spring 13 is constituted by an elastic member made in the form of a hollow shape, and adapted to urge the first and second conductive members 11 and 12 in outward directions (upward and downward directions in FIG. 1) opposite to each other when one of the first and second conductive members 11 and 12 advances to within a predetermined distance of the other of the first and second conductive members 11 and 12. Here, the term "elastic member" is intended to indicate an elastic object made of metal, viscoelastic material such as for example rubber, plastic, or composite material. The elastic member may be constituted by a cylinder having an intermediate portion constituted by a plurality of strip-shaped segments bended or flexed in radius.

In this embodiment, the intermediate portion 13*c* of the coiled compression spring 13 exceeds, in coil pitch, each of the end portions 13*a* and 13*b* of the coiled compression spring 13. More specifically, the coiled compression spring 13 has a shape similar to a hand drum "tsuzumi" constricted in the middle. In other wards, each of the end portions 13*a* and 13*b* of the coiled compression spring 13 is larger in diameter than the intermediate portion 13*c* of the coiled compression spring 13. Needless to say, the coiled compression spring 13 is not limited to a specific shape. The coiled compression spring 13 may have the shape of a normal cylinder, a circular cone, or the like. The coiled compression spring 13 is not limited to a circle in cross section (for example, the coiled compression spring 13 may have the shape of a rectangle in cross section).

The first and second conductive members 11 and 12 are electrically connected to each other through the third conductive member 14 received in the coiled compression spring 13. Here, the third conductive member 14 exceeds in electric conductivity the first conductive member 11, or the first and second conductive members 11 and 12. The third conductive member 14 is made of oxygen-free copper, beryllium copper, or other copper alloy. The third conductive member 14 received in and supported by the coiled compression spring 13 is roughly in parallel relationship with the central axis of the coiled compression spring 13, or pointed in a direction (largely similar to its axial direction; the coiled compression spring 13 exaggeratingly inclined at a slight angle with respect to the axial direction is shown in FIG. 1), and slidably received in holes 11c and 12c of the first and second conductive members 11 and 12.

The third conductive member 14 has first and second end portions 14a and 14b, and an intermediate portion 14c intervening between the first and second end portions 14a and 14b. The intermediate portion 14c is larger in diameter than each of the first and second end portions 14a and 14b. In this embodiment, the intermediate portion 14c enlarged in diameter has the shape of a disk having an annular side surface or "<"-shaped side surface in cross-section. However, the disk-shaped intermediate portion 14c may have a peripheral end partially formed with a circumferential groove, a spiral groove, or the like. Needless to say, the present invention is not limited to the shape of intermediate portion 14c. The third conductive member 14 may be inferior in hardness to the first conductive member 11.

If the third conductive member 14 is made of free-machining material, the third conductive member 14 can be simply in machining process in comparison with that of the conventional contact probe. If the third conductive member 14 is made of ductile and malleable material, the third conductive member 14 can be simple in pressure shaping state in comparison with that of the conventional contact probe. In this embodiment, each of the end portions 14a and 14b is the same in material as the intermediate portion 14c. The third conductive member 14 is integrally machined in machining process. However, each of the end portions 14a and 14b may be different in material from the intermediate portion 14c. The end portions 14a and 14b, and the intermediate portion 14c are separately machined in machining process.

The end portions 13a and 13b of the coiled compression spring 13 are respectively smaller in inner diameter than the respective diameters of the fitting portions 11e and 12e of the first and second conductive members 11 and 12. The end portions 13a and 13b of the coiled compression spring 13 are adapted to tighten the respective fitting portions 11e and 12e of the first and second conductive members 11 and 12 in their radial directions when the fitting portions 11e and 12e of the first and second conductive members 11 and 12 are tightly received in the respective end portions 13a and 13b of the coiled compression spring 13 in assembling process. More specifically, the double-ended contact probe according to the first embodiment can prevent the first and second conductive members 11 and 12 from falling out of the coiled compression spring 13, and can be reduced in machining and the like by reason that each of the first and second conductive members 11 and 12 has a self-retaining function, the first and second conductive members 11 and 12 are retained by the coiled compression spring 13 at the time of connecting the first and second conductive members 11 and 12 to the coiled compression spring 13. The first and second conductive members 11 and 12 can be improved in self-retaining function by having respective concave portions 11n and 12n formed with circumferential ends of the fitting portions 11e and 12e, and defined as a circumferential groove, a helical groove, at least two grooves parallel to each other, and the like. Each of the fitting portions 11e and 12e of the first and second conductive members 11 and 12 has a circumferential chamfered edge, and has a shape partly or wholly tapered at a predetermined angle.

The intermediate portion 13c of the coiled compression spring 13 is adapted to allow the third conductive member 14 to be pointed in a specific direction to ensure that the third conductive member 14 is slidably movable with respect to each of the first and second conductive members 11 and 12. The inner diameter of the intermediate portion 13c of the coiled compression spring 13 is slightly smaller than the outer diameter of the intermediate portion 14c of the third conductive member 14. This leads to the fact that the third conductive member 14 is slightly slanted by the coiled compression spring 13 under the condition that, for example, the peripheral part of the intermediate portion 14c of the third conductive member 14 is received in a groove defined by a tightly-coiled spring 13c, and touched with an inner surface of the tightly-coiled spring 13c. Needless to say, the intermediate portion 14c of the third conductive member 14 may be tightly received in the intermediate portion 13c of the coiled compression spring 13.

The following description will be then directed to a method of assembling the double-ended contact probe according to the first embodiment of the present invention.

As shown in FIG. 2(a), the second conductive member 12 is connected to the coiled compression spring 13 through steps of allowing the fitting portion 12e of the second conductive member 12 to be tightly received in the end portion 13b of the coiled compression spring 13, and allowing the flange portion 12f of the second conductive member 12 to be engaged with the end portion 13b of the coiled compression spring 13. Accordingly, the coiled compression spring 13 can be transported to a designated destination without failing to retain the second conductive member 12, and can be detached from the coiled compression spring 13 by an external force equal to or larger than a predetermined threshold level. As shown in FIG. 2(a), the coil pitch "p2" of the intermediate portion 13b of the coiled compression spring 13 is smaller than the coil pitch "p1" of the remaining part of the coiled compression spring 13.

At the time of having the third conductive member 14 moved along an axis of the second conductive member 12, and toward the hole 12c of the second conductive member 12, the second portion 14b of the third conductive member 14 is partially inserted into the hole 12c of the second conductive member 12 (see FIGS. 2(a) and 2(b)). At this moment, the lower half of the coiled compression spring 13 (defined on the side of the second conductive member 12) is in a compressed state, for example, a state in which the lower half of the coiled compression spring 13 is increased in winding density, and the same as a tightly-coiled spring.

At the time of bring the second end portion 14b (or the first end portion 14a) of the third conductive member 14 into contact with both an inner side surface and an inner bottom surface of the second conductive member 12, the hole 12c being partially defined by each of the inner side surface and the inner bottom surface, or bring the second end portion 14b (or the first end portion 14a) of the third conductive member 14 into contact with one of the inner side surface and the inner bottom surface of the second conductive member 12, and close to the other of the other of the inner side surface and the inner bottom surface of the second conductive member 12, the intermediate portion 14c of the third conductive member 14 is received in, and retained by the intermediate portion 13c of the coiled compression spring 13.

The linearity and shape of the coiled compression spring 13 and the depth of the hole 12c are determined in the design phase on the condition that the half length "Lp/2" of the third conductive member 14 is approximately equal to the sum "h1+h2" of the length "h1" of the compressed lower half of the coiled compression spring 13 and the depth "h2" from the end face (brought into contact with the end face on the side of the compressed lower half) of the flange portion 12f to the inner bottom surface (contact point) of the hole 12c at the time of bring the second end portion 14b of the third conductive member 14 into contact with the inner bottom surface of the second conductive member 12 as shown in FIG. 2(b).

The inner diameter "d1" of the hole 12c of the second conductive member 12 is determined in the design phase, in view of an outer diameter "d2" of the second end portion 14b of the third conductive member 14, an angle "θ" of the central axis of the third conductive member 14 to the central axis of the second conductive member 12, a gap "g" between the second and third conductive members 12 and 14 appropriately defined on the condition that the second and third conductive members 12 and 14 are slidably movable with respect to each other, a value "e" calculated from a dimensional tolerance of each element, dimensional allowance, and the like, on the basis of an expression (d1≧d2/cos θ+g+e; here, g>(d1+d2)sin θ).

After the intermediate portion 14c of the third conductive member 14 is connected to, and retained by the intermediate portion 13c of the coiled compression spring 13, as shown in FIG. 2(c), the first conductive member 11 is connected to, and retained by the coiled compression spring 13 through steps of allowing the fitting portion 11f of the first conductive member 11 to be tightly received in the first end portion 13a of the coiled compression spring 13, and allowing the fitting portion 11f of the first conductive member 11 to be brought into contact with one of end faces of the coiled compression spring 13. At this moment, the angle "θ" of the central axis of the third conductive member 14 to the central axis of the second conductive member 12 is somewhat larger than a definitive angle. However the angle "θ" of the central axis of the third conductive member 14 to the central axis of the second conductive member 12 is within a predetermined range by the hole 11c of the second conductive member 12. Further, the first end portion 14a of the third conductive member 14 can be easily inserted into the hole 11c of the first conductive member 11, the second conductive member 12 can be retained by the coiled compression spring 13 at the time of connecting the second conductive member 12 to the end portion 13b of the coiled compression spring 13, and inserting the third conductive member 14 into the coiled compression spring 13, the side portion 13a of the coiled compression spring 13 is compressed in its axial direction, increased in winding density, and the same as a tightly-coiled spring, and bringing the first end portion 14a of the third conductive member 14 into contact with both an inner side surface and an inner bottom surface of the second conductive member 12.

The following description will be then directed to the operation of the double-ended contact probe according to the first embodiment of the present invention.

As shown in FIG. 3, the contact portion 11a of the first conductive member 11 is brought into contact with a connecting terminal of an object 30 such as IC package, integrated circuits produced on a wafer, or the like. On the other hand, the contact portion 12a of the first conductive member 12 is brought into contact with a connecting terminal 41 of a circuit board 40 forming part of an apparatus for testing or diagnosing the object 30. The coiled compression spring 13 allows the first and second conductive members 11 and 12 to be movable with respect to each other within respective allowable ranges "S1" and "S2", maintains electrical conduction between the first conductive member 11 and the connecting terminal of the object 30 by allowing the first conductive member 11 to contact with the connecting terminal of the object 30 with an appropriate contact pressure, and maintains electrical conduction between the second conductive member 12 and the connecting terminal 41 of the circuit board 40 by allowing the second conductive member 12 to contact with the connecting terminal 41 of the circuit board 40 with an appropriate contact pressure.

As will be seen from FIGS. 1 to 3, the double-ended contact probe according to the first embodiment is shown as one of contact probes built into IC socket mounted on an apparatus for testing a trial sample or the like. Each of the remaining contact probes (not shown) is the same in construction as the above-mentioned double-ended contact probe, and will not described hereinafter.

In the double-ended contact probe according to the first embodiment, the first and second conductive members 11 and 12 are electrically connected to each other through the third conductive member 14. Here, the third conductive member 14 exceeds in electrical conductivity each of the first and second conductive members 11 and 12. The third conductive member 14 is slidably movable with respect to each of the first and second conductive members 11 and 12 under the condition that the third conductive member 14 is retained by the intermediate portion 13c of the coiled compression spring 13. From the foregoing description, it will be understood that the double-ended contact probe can allow the first and second conductive members 11 and 12 to be movable along the central axis with respect each other while maintaining electrical conduction between the first and second conductive members 11 and 12. The appropriate electrical properties, abrasion-resistant properties, machining properties, and the like of the first to third conductive members 11, 12, and 14 can be individually determined in the design phase, and can be made of lead-free material. The double-ended contact probe according to the present invention can halve, in depth, the holes 11e and 12e of the first and second conductive members 11 and 12 in comparison with the barrel of the conventional contact probe, and can be improved in production cost.

In the double-ended contact probe according to the first embodiment, each of the first and second conductive members 11 and 12 can be reduced in length, and simple in shape in comparison with the conventional contact probe by reason that the first and second conductive members 11 and 12 are connected to, and retained by the respective end portions 13a and 13b of the coiled compression spring 13. The slide portions of the first and second conductive members 11 and 12 (slidably moved with respect to, and brought into contact with the slide portion of the third conductive members 14) can be reduced in machining accuracy in comparison with the conventional contact probe.

The double-ended contact probe according to the first embodiment can be simple, reduced in fabrication by reason that, at the time of connecting the first conductive member 11 (or the second conductive member 12) to the end portion 13a (or the end portion 13b) of the coiled compression spring 13, and inserting the third conductive member 14 into the coiled compression spring 13, the side portion of the coiled compression spring 13 (for example, on the side of the first conductive member 11, is compressed in its axial direction, increased in winding density, and the same as a tightly-coiled spring, the second end portion 14b (or the first end portion 14a) of the third conductive member 14 is brought into contact with both an inner side surface and an inner bottom surface of the second conductive member 12, the hole 12c being partially defined by each of the inner side surface and the inner bottom surface, or bring the second end portion 14b (or the first end portion 14a) of the third conductive member 14 into contact with one of the inner side surface and the inner bottom surface of the second conductive member 12, and close to the other of the other of the inner side surface and the inner bottom surface of the second conductive member 12, the intermediate portion 14c of the third conductive member 14 is received in, and retained by the intermediate portion 13c of the coiled compression spring 13.

It is easy to insert the third conductive member 14 into the coiled compression spring 13 by reason that the inner diameter "D1" of either or both the end portion 13a and 13b of the coiled compression spring 13 is larger than the inner diameter "D3" of the intermediate portion 13c of the coiled compression spring 13.

In the double-ended contact probe according to the first embodiment, the required total displacement "S1+S2" of the first and second conductive members 11 and 12 can be adjusted by the total depth "h2+h3" of the holes 11c and 12c. Further, the double-ended contact probe according to the first embodiment can prevent the first and second conductive members 11 and 12 from falling out of the coiled compression spring 13, and can be reduced in machining and the like by reason that each of the first and second conductive members 11 and 12 has a self-retaining function, the first and second conductive members 11 and 12 are retained by the coiled compression spring 13 at the time of connecting the first and second conductive members 11 and 12 to the coiled compression spring 13. The first and second conductive members 51 and 52 may be standardized as common parts. In this case, the first and second conductive members 51 and 52 standardized as common parts are the same in shape as each other.

Second Embodiment

Figure 4:
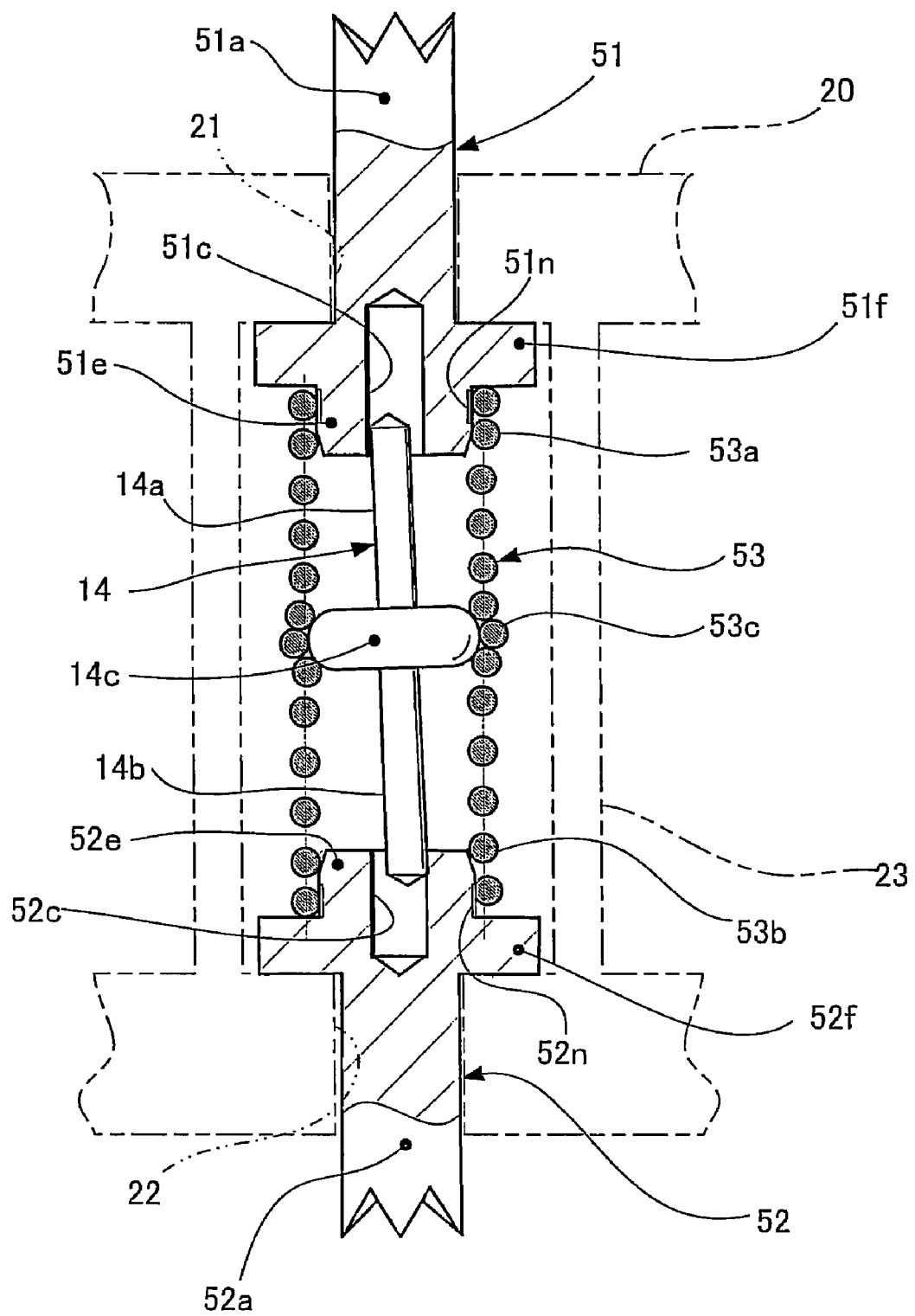
FIG. 4 is a cross-sectional view showing the double-ended contact probe according to the second embodiment of the present invention.

FIG. 4 is a cross-sectional view showing the double-ended contact probe according to the second embodiment of the present invention. In the first embodiment, the contact portions of the first and second conductive members are different in shape from each other. However, the first and second conductive members are the same in shape as each other, and constituted as common parts in the second embodiment as shown in FIG. 4. In the first embodiment, the coiled compression spring identified as an elastic member has a shape similar to a hand drum "tsuzumi" constricted in the middle. On the other hand, the coiled compression spring identified as an elastic member has the shape of a cylinder in the second embodiment. The constitution elements of the double-ended contact probe according to the second embodiment is substantially the same as those of the double-ended contact probe according to the first embodiment except for the first and second conductive members and the coiled compression spring. Therefore, the constitution elements of the double-ended contact probe according to the second embodiment substantially the same as those of the double-ended contact probe according to the first embodiment will not be described but bear the same reference numerals as those of the double-ended contact probe according to the first embodiment.

As shown in FIG. 4, the double-ended contact probe comprises first and second conductive members 51 and 52 to be constituted as electrical contact elements in the second embodiment. The double-ended contact probes built into IC socket 20 at even intervals are in parallel relationship with each other (in a horizontal direction in FIG. 4).

The double-ended contact probe further comprises a coiled compression spring 53 made in the form of a cylinder (its intermediate portion may be slightly small in diameter in comparison with each end portion), the coiled compression spring 53 intervening between the first and second conductive members 51 and 52. The coiled compression spring 53 is adapted to urge the first and second conductive members 51 and 52 in respective axial directions opposite to each other, to allow the first and second conductive members 51 and 52 to be movable with respect to each other in the respective axial directions, and to allow contact portions 51a and 52a of the first and second conductive members 51 and 52 to be projected from the IC socket 20 in the respective axial directions. The first conductive member 51 has a flange portion 51f larger in diameter than the contact portion 51a, the flange portion 51f having an end face brought into contact with one of end faces of the coiled compression spring 53, a fitting portion 51e projected from one end of the flange portion 51f in an inner direction (the other of the axial directions), and tightly received in one of end portions of the coiled compression spring 53, and a bottomed hole (or through hole) 51c having an axis axially aligned with an axis of the flange portion 51f. The second conductive member 52 has a flange portion 52f larger in diameter than the contact portion 52a, the flange portion 52f having an end face brought into contact with the other of end faces of the coiled compression spring 53, and a fitting portion 52e projected from one end of the flange portion 52f in an inner direction (one of the axial directions), and tightly received in one of end portions of the coiled compression spring 53, and a bottomed hole (or through hole) 52c having an axis axially aligned with an axis of the flange portion 52f. The first and second conductive members 51 and 52 are movable with respect to each other in the axial directions under the condition that the contact portions 51a and 52a constituted as conductive portions projected from the other ends of the flange portions 51f and 52f in outer directions are movably received in respective openings 21 and 22 of the IC socket 20.

The coiled compression spring 53 constituted as a hollow shaped elastic member is adapted to urge the first and second conductive members 11 and 12 in respective outward directions (upper and lower directions in FIG. 4) opposite to each other when one of the first and second conductive members 11 and 12 approaches within a predetermined distance of the other of the first and second conductive members 11 and 12. The coiled compression spring 73 has an intermediate portion 73c having a shape similar to a hand drum "tsuzumi" constricted in the middle, or a constricted intermediate portion 73c intervening between the cylindrical end portions 73a and 73b, and has a shape substantially the same as a cylinder. The intermediate portion is smaller in coil pitch and in inner diameter than each of the end portions 73a and 73b. The coiled compression spring 53 has end portions 53a and 53b, and an intermediate portion 53c smaller in coil pitch than each of the end portions 53a and 53b, and substantially equal in inner diameter to each of the end portions 53a and 53b (the intermediate portion 53c may be slightly small in inner diameter in comparison with each of the end portions 53a and 53b), and has the shape of a cylinder. Additionally, the coiled compression spring 53 may have cylindrical end portions 53a and 53b and a constricted intermediate portion 53c intervening between the cylindrical end portions 53a and 53b. More specifically, the constricted intermediate portion 53c is smaller in inner diameter than each of the cylindrical end portions 53a and 53b. The cylindrical end portions 53a and 53b are substantially the same in inner diameter as each other.

The first and second conductive members 51 and 52 are electrically connected to each other through the third conductive member 14 made of copper alloy or other metal having high electrical conductivity, and accommodated in the coiled compression spring 53. Here, the intermediate portion 14c of the third conductive member 14 may have a spherical side surface (the third conductive member 14 may have an intermediate portion 53c with chamfered edge) to ensure that the third conductive member 14 is easily built into the coiled compression spring 53 in the process of assembling the double-ended contact probe according to the second embodiment. The first and second end portions 14a and 14b of the third conductive member 14 retained the coiled compression spring 53, and inclined with respect to the central axis at a slight angle (as shown in FIG. 4 in an exaggerated form) is slidably received in the respective holes 51c and 52c of the first and second conductive members 51 and 52.

As in the first embodiment, the inner diameters of the end portions 53a and 53b of the coiled compression spring 53 are respectively smaller than the outer diameters of the fitting portions 11e and 12e of the first and second conductive members 11 and 12. When the fitting portions 11e and 12e of the first and second conductive members 11 and 12 are tightly received in the respective end portions 53a and 53b of the coiled compression spring 53, the end portions 53a and 53b of the coiled compression spring 53 are adapted to tighten the respective fitting portions 11e and 12e in its radial direction with predetermined pressure. In other words, the coiled compression spring 53 is adapted to allow the first and second conductive members 11 and 12 to function as movable portions of the double-ended contact probe by having end portions 53a and 53b for retaining the first and second conductive members 11 and 12. Additionally, the fitting portion 51a of the first conductive member 51 has an outer circumferential section 51n formed with a groove, as shown with a phantom line in FIG. 4, to ensure that the first conductive member 51 is tightly connected to the coiled compression spring 63. The fitting portion 52a of the second conductive member 52 has an outer circumferential section 52n formed with a groove, shown with an imaginary line in FIG. 4, to ensure that the second conductive member 51 is tightly connected to the coiled compression spring 63. Here, the first and second conductive members 51 and 52 may have fitting portions 51e and 52e with chamfered edges, or partly- or wholly-tapered fitting portions 51e and 52e, respectively.

The coiled compression spring 53 has an intermediate portion 53c for retaining the third conductive member 14 to ensure that the third conductive member 14 is slidably movable with respect to the first and second conductive members 51 and 52. The inner diameter of the intermediate portion 53c of the coiled compression spring 53 is small by a predetermined value in comparison with the outer diameter of the intermediate portion 14c of the third conductive member 14.

From the foregoing description, it will be understood that the double-ended contact probe according to the second embodiment can allow the first and second conductive members 51 and 52 to be movable with respect each other in axial directions while maintaining electrical conduction between the first and second conductive members 51 and 52 by reason that the first and second conductive members 51 and 52 is electrically connected to each other through the third conductive member 14, the coiled compression spring 53 is adapted to allow the third conductive member 14 to be stably pointed in a specific direction, and to be slidably movable with respect to each of the first and second conductive members 51 and 52. The double-ended contact probe according to the second embodiment can allow the first and second conductive members 51 and 52 to be simple in shape, and to be short in length, and can prevent the slide portions of the third conductive member 14 to the first and second conductive members 51 and 52 from being precisely machined with high dimensional accuracy by reason that the first and second conductive members 51 and 52 are retained by and connected to the end portions 53a and 53b of the coiled compression spring 53.

From the foregoing description, it will be understood that the double-ended contact probe according to the second embodiment of the present invention can be reduced in machining cost by reason that each of the holes 51c and 52c of the first and second conductive members 51 and 52 is small in depth, and be further reduced in production cost by reason that the coiled compression member 53 is adapted to retain the third conductive member 14, and to allow the third conductive member 14 to be slidably movable within the additional value of the depths of the holes of the first and second conductive members 51 and 52 even if each of the holes of the first and second conductive members 51 and 52 is small in depth.

From the foregoing description, it will be understood that the double-ended contact probe according to the second embodiment of the present invention can be further reduced in production cost, and can be simple in the process of building the double-ended contact probes into the IC socket 20, and in the process of managing those parts by reason that the first and second conductive members are the same in shape as each other, and constituted as common parts.

Third Embodiment

Figure 5:
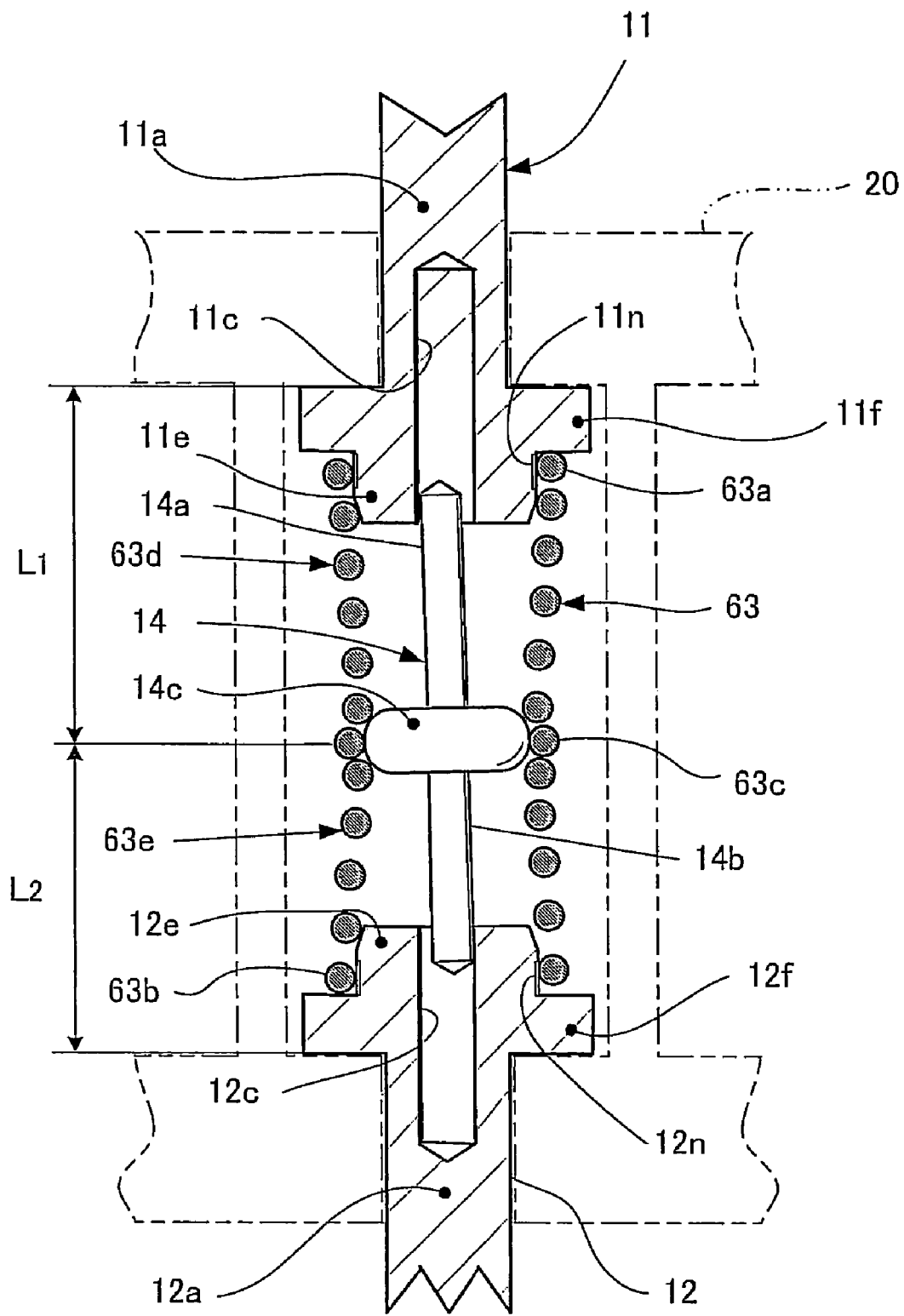
FIG. 5 is a cross-sectional view showing the double-ended contact probe according to the third embodiment of the present invention.
Figure 6:
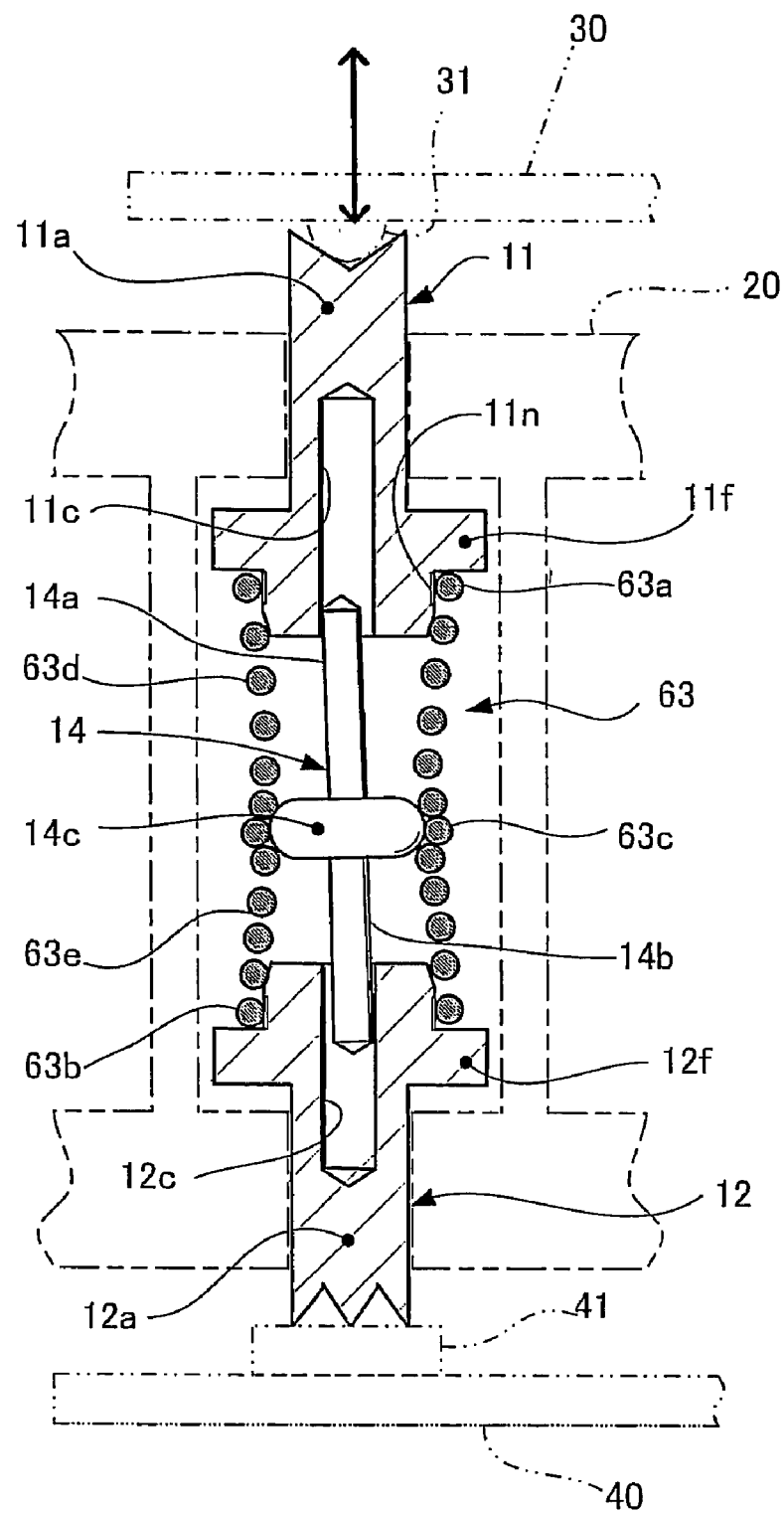
FIG. 6 is a cross-sectional view showing an operation of the double-ended contact probe, built into the IC socket, according to the third embodiment of the present invention.

FIGS. 5 and 6 are cross-sectional views showing the double-ended contact probe according to the third embodiment of the present invention. The coiled compression spring constituted as an elastic member in the double-ended contact probe according to the third embodiment is different in shape from that of the double-ended contact probe according to the first embodiment. The constitution elements of the double-ended contact probe according to the third embodiment is substantially the same as those of the double-ended contact probe according to the first embodiment with the exception of the coiled compression spring. Therefore, the constitution elements of the double-ended contact probe according to the third embodiment substantially the same as those of the double-ended contact probe according to the first embodiment will not be described but bear the same reference numerals as those of the double-ended contact probe according to the first embodiment.

As shown in FIGS. 5 and 6, the double-ended contact probe according to the third embodiment comprises a coiled compression spring 63 in place of the above-mentioned coiled compression spring 13.

As in the first embodiment, the inner diameters of the end portions 63a and 63b of the coiled compression spring 63 are respectively smaller than the outer diameters of the fitting portions 11e and 12e of the first and second conductive members 11 and 12. When the fitting portions 11e and 12e of the first and second conductive members 11 and 12 are tightly received in the respective end portions 63a and 63b of the coiled compression spring 63, the end portions 63a and 63b of the coiled compression spring 63 are adapted to tighten the respective fitting portions 11e and 12e in its radial direction with predetermined pressure. In other words, the coiled compression spring 63 is adapted to allow the first and second conductive members 11 and 12 to function as movable portions of the double-ended contact probe by having end portions 63a and 63b for retaining the first and second conductive members 11 and 12.

The coiled compression spring 63 has an intermediate portion 63c for retaining the third conductive member 14 to ensure that the third conductive member 14 is slidably movable with respect to the first and second conductive members 11 and 12. The inner diameter of the intermediate portion 63c of the coiled compression spring 63 is small by a predetermined value in comparison with the outer diameter of the intermediate portion 14c of the third conductive member 14.

The coiled compression spring 63 constituted as a hollow shaped elastic member is adapted to urge the first and second conductive members 11 and 12 in respective outward directions (upper and lower directions in FIGS. 5 and 6) opposite to each other when one of the first and second conductive members 11 and 12 approaches within a predetermined distance of the other of the first and second conductive members 11 and 12. The coiled compression spring 63 has an intermediate portion 63c having a shape similar to a hand drum "tsuzumi" constricted in the middle, or a constricted intermediate portion 63c intervening between the cylindrical end portions 63a and 63b, and has a shape substantially the same as a cylinder. The intermediate portion is smaller in coil pitch and in inner diameter than each of the end portions 63a and 63b.

The coiled compression spring 63 has a side spring portion 63d intervening between the end portion 63a and the intermediate portion 63c, and a side spring portion 63e intervening between the end portion 63b and the intermediate portion 63c. The coiled compression spring 63 has a minimum inner diameter at each of the boundaries between the intermediate portion 63c and the side spring portion 63d, and between the intermediate portion 63c and the side spring portion 63e. The coiled compression spring 63 has a maximum inner diameter at each of the boundaries between the end portion 63a and the side spring portion 63d, and between the end portion 63b and the side spring portion 63e. Needless to say, the end portions 63a and 63b of the coiled compression spring 63 may be different in inner diameter from each other if the fitting portions 11e and 12e of the first and second conductive members 11 and 12 are different in outer diameter from each other. The end portions 63a and 63b may be the same in inner diameter as each other if the coiled compression spring 63 has substantially the shape of a cylinder, and has a constricted intermediate portion 63c.

The side spring portions 63d and 63e of the coiled compression spring 63 are different in free length from each other. Accordingly, the lengths L1 and L2 of the side spring portions 63d and 63e are different from each other (length L1>length L2) in the double-ended contact probe built into IC socket 20. In FIG. 5, the side spring portions 63d and 63e are the same in coil pitch as each other. However, the side spring portions 63d and 63e may be different in coil pitch from each other. If the coiled compression spring 63 has a constricted intermediate portion 63c, the side spring portions 63d and 63e may be different in free length from each other, equal in coil pitch to each other, and have the shape of a cylinder. The side spring portions 63d and 63e may be different in coil pitch from each other.

From the foregoing description, it will be understood that the double-ended contact probe according to the third embodiment can expect an advantageous effect the same as that of the double-ended contact probe of the first embodiment. When the first conductive member 11 is repeatedly compressed by a test object 30 in a downward direction shown in FIG. 6, the double-ended contact probe according to the third embodiment can allow the spring portion 63d smaller in spring constant than the spring portion 63e to maintain, within an appropriate range, a contact pressure of the first conductive member 11 to the test object 30 while allowing the spring portion 63e larger in spring constant than the spring portion 63d to point the third conductive member 14 in a specific direction under the condition that the second conductive member 12 is allowed to keep in contact with a circuit board 40 by reason that the side spring portions 63d and 63e of the coiled compression spring 63 are different in spring constant from each other, more specifically, the side spring portion 63d positioned on the side of the first conductive member 11 is larger in free length than the side spring portion 63e. The double-ended contact probe according to the third embodiment can be improved in displacement of one of the first and second conductive members 11 and 12 to the other of the first and second conductive members 11 and 12, and maintain, at an appropriate level, electrical conduction between the circuit board 40 and the test object 30 by having a high tolerance for repeated use.

When the side spring portions 63d and 63e of the coiled compression spring 63 the same in coil pitch as each other are combined in series, the coiled compression spring 63 acts on the first and second conductive members 11 and 12 with linear load-displacement characteristics. When, on the other hand, the side spring portions 63d and 63e of the coiled compression spring 63 different in coil pitch from each other are combined in series, the coiled compression spring 63 acts on the first and second conductive members 11 and 12 with non-linear load-displacement characteristics.

Fourth Embodiment

Figure 7:
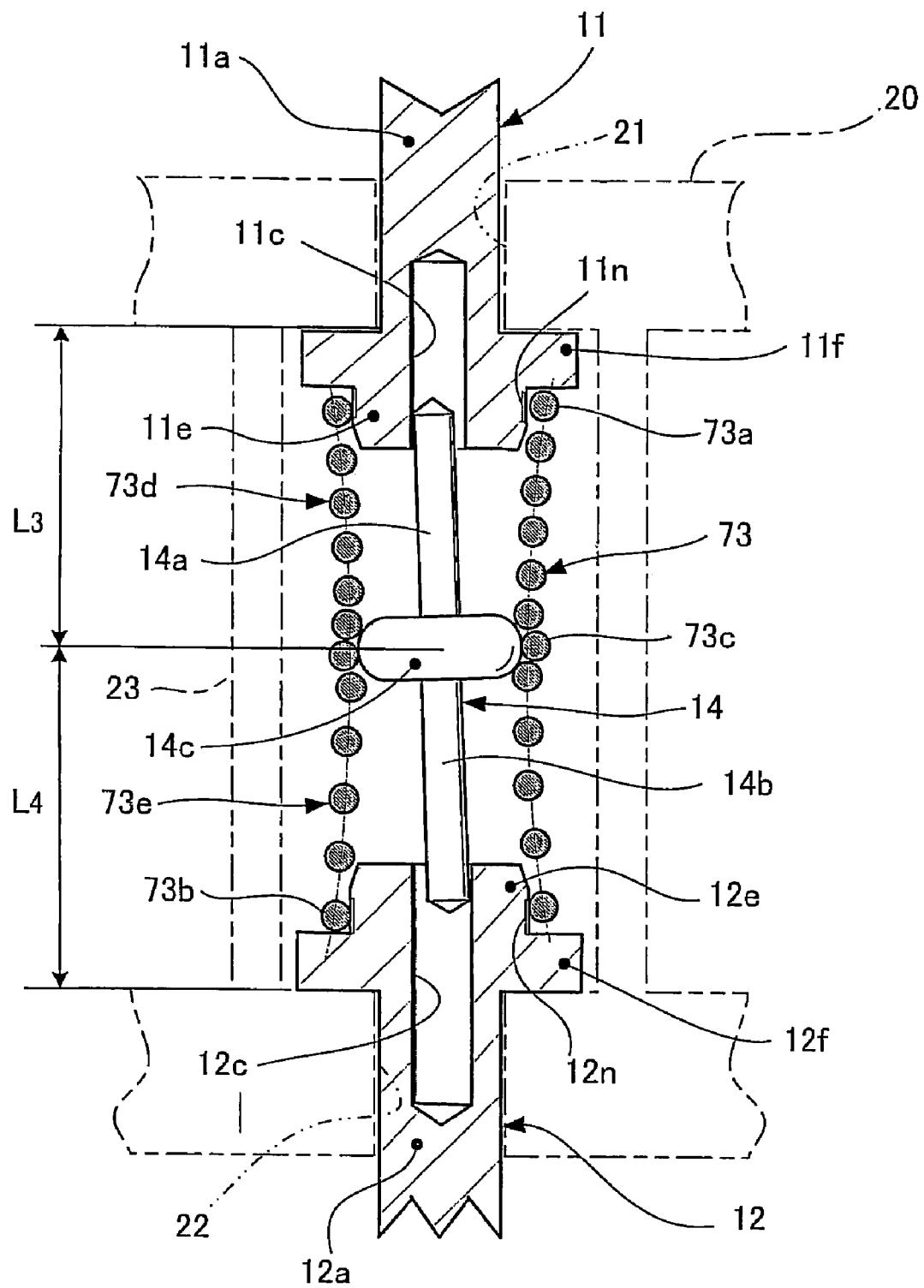
FIG. 7 is a cross-sectional view showing the double-ended contact probe according to the fourth embodiment of the present invention.

FIG. 7 is a cross-sectional view showing the double-ended contact probe according to the fourth embodiment of the present invention. The coiled compression spring constituted as an elastic member in the double-ended contact probe according to the third embodiment is different in shape from the coiled compression spring of the double-ended contact probe according to the first embodiment. The constitution elements of the double-ended contact probe according to the third embodiment is substantially the same as those of the double-ended contact probe according to the first embodiment except for the coiled compression spring. Therefore, the constitution elements of the double-ended contact probe according to the fourth embodiment substantially the same as those of the double-ended contact probe according to the first embodiment will not be described but bear the same reference numerals as those of the double-ended contact probe according to the first embodiment.

As shown in FIG. 7, the double-ended contact probe according to the fourth embodiment comprises a coiled compression spring 73 in place of the above-mentioned coiled compression spring 13.

As in the first embodiment, the inner diameters of the end portions 73a and 73b of the coiled compression spring 73 are respectively smaller than the outer diameters of the fitting portions 11e and 12e of the first and second conductive members 11 and 12. When the fitting portions 11e and 12e of the first and second conductive members 11 and 12 are tightly received in the respective end portions 73a and 73b of the coiled compression spring 73, the end portions 73a and 73b of the coiled compression spring 73 are adapted to tighten the respective fitting portions 11e and 12e in its radial direction with predetermined pressure. In other words, the coiled compression spring 73 is adapted to allow the first and second conductive members 11 and 12 to function as movable portions of the double-ended contact probe by having end portions 73a and 73b for retaining the first and second conductive members 11 and 12.

The coiled compression spring 73 has an intermediate portion 73c for retaining the third conductive member 14 to ensure that the third conductive member 14 is slidably movable with respect to the first and second conductive members 11 and 12. The inner diameter of the intermediate portion 73c of the coiled compression spring 73 is small by a predetermined value in comparison with the outer diameter of the intermediate portion 14c of the third conductive member 14.

The coiled compression spring 73 constituted as a hollow shaped elastic member is adapted to urge the first and second conductive members 11 and 12 in respective outward directions (upper and lower directions in FIG. 7) opposite to each other when one of the first and second conductive members 11 and 12 approaches within a predetermined distance of the other of the first and second conductive members 11 and 12. The coiled compression spring 73 has an intermediate portion 73c having a shape similar to a hand drum "tsuzumi" constricted in the middle, or a constricted intermediate portion 73c intervening between the cylindrical end portions 73a and 73b, and has a shape substantially the same as a cylinder. The intermediate portion is smaller in coil pitch and in inner diameter than each of the end portions 73a and 73b.

The coiled compression spring 73 has a side spring portion 73d intervening between the end portion 73a and the intermediate portion 73c, and a side spring portion 73e intervening between the end portion 73b and the intermediate portion 73c. The coiled compression spring 73 has a minimum inner diameter at each of the boundaries between the intermediate portion 73c and the side spring portion 73d, and between the intermediate portion 73c and the side spring portion 73e. Those minimum inner diameters are substantially the same as each other. The coiled compression spring 73 has a maximum inner diameter at each of the boundaries between the end portion 73a and the side spring portion 73d, and between the end portion 73b and the side spring portion 73e. Those maximum inner diameters are substantially the same as each other. The side spring portions 73d and 73e are different in coil pitch from each other.

More specifically, the side spring portions 73d and 73e are approximately, or substantially the same in length as each other (length L3=length L4) in the double-ended contact probe built into IC socket 20. However, the side spring portions 73d and 73e are different in coil pitch from each other. In other words, the side spring portion 73d is smaller in coil pitch from the side spring portion 73e. It is preferable that the side spring portion 73d is smaller in coil pitch from the side spring portion 73e under the condition that the side spring portions 73d and 73e are different in coil pitch from each other. Additionally, it is preferable that the side spring portions 73d and 73e are the same in coil pitch as each other under the condition that the coiled compression spring 73 has substantially the shape of a cylinder, and has a constricted intermediate portion 73c.

From the foregoing description, it will be understood that the coiled compression spring according to the fourth embodiment can expect an advantageous effect of the coiled compression spring according to the first embodiment. When the first conductive member 11 is repeatedly compressed by a test object 30 in a downward direction, the double-ended contact probe according to the fourth embodiment can allow the spring portion 73d smaller in spring constant than the spring portion 73e to maintain, within an appropriate range, a contact pressure of the first conductive member 11 to the test object 30 while allowing the spring portion 73e larger in spring constant than the spring portion 73d to point the third conductive member 14 in a specific direction under the condition that the second conductive member 12 is allowed to keep in contact with a circuit board 40 of a socket or an apparatus by reason that the side spring portions 73d and 73e of the coiled compression spring 73 are different in spring constant from each other, more specifically, the side spring portion 73d positioned on the side of the first conductive member 11 is larger in free length than the side spring portion 73e. The double-ended contact probe according to the fourth embodiment can be improved in displacement of one of the first and second conductive members 11 and 12 to the other of the first and second conductive members 11 and 12, and maintain, at an appropriate level, electrical conduction between the circuit board 40 and the test object 30 by having a high tolerance for repeated use.

When the side spring portions 73d and 73e the same in coil pitch as each other are combined in series, the coiled compression spring 73 acts on the first and second conductive members 11 and 12 with linear load-displacement characteristics. When, on the other hand, the side spring portions 73d and 73e different in coil pitch from each other are combined in series, the coiled compression spring 73 acts on the first and second conductive members 11 and 12 with non-linear load-displacement characteristics.

In each embodiment, the intermediate portion 14c of the third conductive member 14 has the shape of a cylinder, or a disc. Each of the ends of the third conductive member 14 has the shape of a cone. However, the intermediate portion of the third conductive member may be constituted by an element having a monotonic surface, and including, as the outer peripheral end, a circumferential end, an element having one or more pairs of surfaces parallel to each other, or an element, made of metal or plastic, having one or more projections, or one or more circular or spiral projected rims. The portions (i.e., shaft portions and intermediate portion) of the third conductive member may be constituted by respective discrete elements. The intermediate portion may be constituted by a pressed element (or molded element) having two or more projections having a specific shape to perform a specific function. For example, the elastic member may have a retainer for retaining the third conductive member. In this case, the third conductive member may have an intermediate portion slightly enlarged in diameter, or reduced in diameter.

The third conductive member may have ends enlarged in diameter, and accentuated as portions for touching the first and second conductive members, or may have respective circular hollow shaped portions. It is not essential that the third conductive member have an intermediate portion axially aliened with each of the end portions. More specifically, the intermediate portion may be in eccentric and parallel relationship with the end portions. The double-ended contact probe may have a mechanism for preventing the eccentric intermediate portion from being inclined with respect to the central axis of the elastic member while allowing the third conductive member to be slidably movable with respect to each of the first and second conductive members. In order to increase a slide pressure with which each of the first and second conductive members is brought into contact with the third conductive member, each of the holes may be slightly tapered toward its tip, third conductive member being brought into contact with the first and second conductive members with the increased contact pressure when the first and second conductive members come close to each other. Needless to say, each of the first and second conductive members is the same in material as the third conductive member under the condition that each of the first and second conductive members is made of a material having required electrical characteristics and the like (for example, abrasion-resistant, endurance strength, free-machining material). Even if each of the first and second conductive members is the same in material as the third conductive member, the double-ended contact probe according to the present invention can have required electrical and mechanical characteristics.

In the third and fourth embodiments, the coiled compression spring is constituted by coiled compression springs combined in series. However, the coiled compression spring is constituted by coiled compression springs combined in parallel under the condition that the intervals of the double-ended contact probes built in the socket and first and second conductive members is relatively large, the coiled compression springs combined in parallel having non-linear load-displacement characteristics. When, for example, the displacement of the first conductive member is smaller than a predetermined threshold level, one of the coiled compression springs combined in parallel urges the first conductive member. When, on the other hand, the displacement of the first conductive member is larger than the predetermined threshold level, the other of the coiled compression springs combined in parallel urges the first conductive member.

INDUSTRIAL APPLICABILITY OF THE PRESENT INVENTION

As will be seen from the foregoing description, the double-ended contact probe according to the present invention has an advantageous effect of ensuring that the first and second conductive members are stably movable with respect to each other, and electrically connected to each other by reason that the first and second conductive members are electrically connected to each other through the third conductive member, the coiled compression spring intervenes between the first and second conductive members, has an intermediate portion for retaining the third conductive member, and adapted to allow the third conductive member to be pointed in a specific direction, and to be slidably movable with respect to each of the first and second conductive members, and an advantageous effect of keeping a pressure to be applied on a test object within a specific range while allowing the third conductive member to be pointed in a specific direction by reason that the side spring portions are different in spring constant from each other, more specifically, the side spring portion on the part of a retainer is larger in spring constant than the side spring portion on the part of the test object, and useful as a double-ended contact probe to be incorporated in a socket or an apparatus for testing IC package, integrated circuits produced on a wafer, or the like.

What is claimed is:

1. A double-ended contact probe, comprising:
   first and second conductive members constructed as electrical contact portions;
   an elastic member made in the form of a hollow shape, said elastic member intervening between said first and second conductive members to urge said first and second conductive members in respective directions opposite to each other when one of said first and second conductive members approaches within a predetermined distance of the other of said first and second conductive members; and
   a third conductive member accommodated in said elastic member, and disposed on a central axis of said elastic member, wherein
   said elastic member has a pair of end portions for retaining said first and second conductive members, and an intermediate portion for retaining said third conductive member to allow said third conductive member to be pointed in a specific direction, and to be slidably movable with respect to each of said first and second conductive members.

2. A double-ended contact probe as set forth in claim 1, in which said elastic member is constituted by a coiled compression spring having an intermediate portion smaller in coil pitch than a portion other than said intermediate portion.

3. A double-ended contact probe as set forth in claim 1, in which said intermediate portion of said elastic member is constituted by a tightly coiled compression spring.

4. A double-ended contact probe as set forth in claim 1, in which
   said first and second conductive members have respective holes,
   said third conductive member has end portions slidably received in said respective holes of said first and second conductive members, and an intermediate portion larger in diameter than each of said end portions,
   said elastic member is adapted to allow said end portions of said third conductive member retained by said elastic member to touch respective inner side surfaces of said holes of said first and second conductive members, and to approach or touch respective bottom surfaces of said holes of said first and second conductive members when said elastic member is compressed in longitudinal direction under the condition that each of said first and second conductive members are slidably movable with respect to said third conductive member retained by said elastic member.

5. A double-ended contact probe as set forth in claim 1, in which said elastic member is constituted by a coiled compression spring, said intermediate portion being smaller in inner diameter than at least one of said end portions.

6. A double-ended contact probe as set forth in claim 1, in which
   said elastic member is constituted by a coiled compression spring,
   one of said first and second conductive members has a flange portion for touching one end of said coiled compression spring, a conducting portion projected from one end of said flange portion in one of directions opposite to each other, a fitting portion projected from the other end of said flange portion in the other of said directions, and tightly received in one end of said coiled compression spring, and a hole longitudinally extending from one end of said fitting portion,
   the other of said first and second conductive members has a flange portion for touching the other end of said coiled compression spring, a conducting portion projected from one end of said flange portion in the other of said directions, a fitting portion projected from the other end of said flange portion in one of said directions, and tightly received in the other end of said coiled compression spring, and a hole longitudinally extending from one end of said fitting portion.

7. A double-ended contact probe as set forth in claim 1, in which said third conductive member is higher in electric conductivity than said first conductive member.

8. A double-ended contact probe as set forth in claim 7, in which said third conductive member is constituted by copper metal, higher in electric conductivity, and smaller in hardness than said first conductive member.

9. A double-ended contact probe as set forth in claim 1, in which said second conductive member is higher in electric conductivity than said first conductive member.

10. A double-ended contact probe as set forth in claim 1, in which each of said first and second conductive members is the same in electric conductively as said third conductive member.

11. A double-ended contact probe as set forth in claim 1, in which said elastic member is constituted by a coiled compression spring having a side spring portion intervening between one of said end portions and said intermediate portion, and a side spring portion intervening between the other of said end portions and said intermediate portion, said side spring portions being different in free length from each other.

12. A double-ended contact probe as set forth in claim 11, in which said side spring portions of said coiled compression spring are the same in coil pitch as each other.

13. A double-ended contact probe as set forth in claim 11, in which said side spring portions of said coiled compression spring are different in coil pitch from each other.

14. A double-ended contact probe as set forth in claim 1, in which said elastic member is constituted by a coiled compression spring having a side spring portion intervening between one of said end portions and said intermediate portion, and a side spring portion intervening between the other of said end portions and said intermediate portion, said side spring portions being different in coil pitch from each other.

15. A double-ended contact probe as set forth in claim 14, in which said end portions of said elastic member are the same in coil pitch as each other.

16. A double-ended contact probe as set forth in claim 14, in which said end portions of said elastic member are different in coil pitch from each other.

17. A double-ended contact probe as set forth in claim 1, in which said elastic member has a shape constricted in the middle, said elastic member being constituted by a coiled compression spring having side spring portions the same in inner diameter as each other, and an intermediate portion intervening between said side spring portions, said intervening portion being smaller in inner diameter than each of said side spring portions.

* * * * *